United States Patent
Chen et al.

(10) Patent No.: US 9,570,153 B1
(45) Date of Patent: Feb. 14, 2017

(54) MULTI-PORTED STATIC RANDOM ACCESS MEMORY

(71) Applicant: VIA Alliance Semiconductor Co., Ltd., Shanghai (CN)

(72) Inventors: Jiesheng Chen, Shanghai (CN); Jieyao Liu, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/986,917

(22) Filed: Jan. 4, 2016

(30) Foreign Application Priority Data

Dec. 4, 2015 (CN) .......................... 2015 1 0890908

(51) Int. Cl.
| | |
|---|---|
| G11C 11/412 | (2006.01) |
| G11C 5/06 | (2006.01) |
| G11C 11/419 | (2006.01) |
| G11C 11/418 | (2006.01) |
| G11C 8/16 | (2006.01) |

(52) U.S. Cl.
CPC .............. G11C 11/412 (2013.01); G11C 5/06 (2013.01); G11C 11/418 (2013.01); G11C 11/419 (2013.01); G11C 8/16 (2013.01)

(58) Field of Classification Search
CPC ........ G11C 11/412; G11C 5/06; G11C 11/419; G11C 11/418; G11C 8/16
See application file for complete search history.

(56) References Cited

U.S. PATENT DOCUMENTS

| | | | | |
|---|---|---|---|---|
| 7,113,445 B1* | 9/2006 | Sancheti | ............... | G11C 11/412 365/154 |
| 2013/0242677 A1* | 9/2013 | Iyer | ....................... | G11C 11/412 365/189.15 |
| 2014/0269019 A1* | 9/2014 | Kolar | ....................... | G11C 8/16 365/154 |
| 2014/0269022 A1* | 9/2014 | Xie | ........................ | G11C 11/412 365/154 |
| 2015/0023086 A1* | 1/2015 | Wendell | ................... | G11C 5/06 365/72 |
| 2015/0098268 A1* | 4/2015 | Yabuuchi | .............. | G11C 11/419 365/154 |

* cited by examiner

*Primary Examiner* — Richard Elms
*Assistant Examiner* — Ajay Ojha
(74) *Attorney, Agent, or Firm* — McClure, Qualey & Rodack, LLP

(57) ABSTRACT

A static random access memory (SRAM) with high efficiency. The SRAM has a first bistable cell, a first bit line, a first complementary bit line, a first word line, and a second word line. The first bistable cell has a first access terminal, a second access terminal, a first access switch and a second access switch. The first access switch is controlled by the first word line to couple the first access terminal to the first bit line. The second access switch is controlled by the second word line to couple the second access terminal to the first complementary bit line.

16 Claims, 7 Drawing Sheets

MULTI-PORTED STATIC RANDOM ACCESS MEMORY

CROSS REFERENCE TO RELATED APPLICATIONS

This Application claims priority of China Patent Application No. CN201510890908.9, filed on Dec. 4, 2015, the entirety of which is incorporated by reference herein.

BACKGROUND OF THE INVENTION

Field of the Invention

The present invention relates to a static random access memory (SRAM), especially relates to storage cells of SRAM.

Description of the Related Art

Static random access memory (SRAM) is a type of semiconductor memory that uses bistable latching circuitry (e.g., cross-coupled CMOS inverters) to store each bit. How to efficiently access an SRAM is an important topic in the field.

BRIEF SUMMARY OF THE INVENTION

A static random access memory in accordance with an exemplary embodiment of the disclosure includes a first bistable cell, a first bit line, a first complementary bit line, a first word line and a second word line. The first bistable cell has a first access terminal, a second access terminal, a first access switch and a second access switch. The first access switch is controlled by the first word line to couple the first access terminal to the first bit line. The second access switch is controlled by the second word line to couple the second access terminal to the first complementary bit line. The first access switch and the second access switch are controlled separately. Thus, the access efficiency of the SRAM is considerably improved.

In comparison with conventional techniques, the bistable cells of the disclosure use less number of transistors for multiple read operations or multiple write operations, making maximum utilization of storage space and more efficient.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1A:
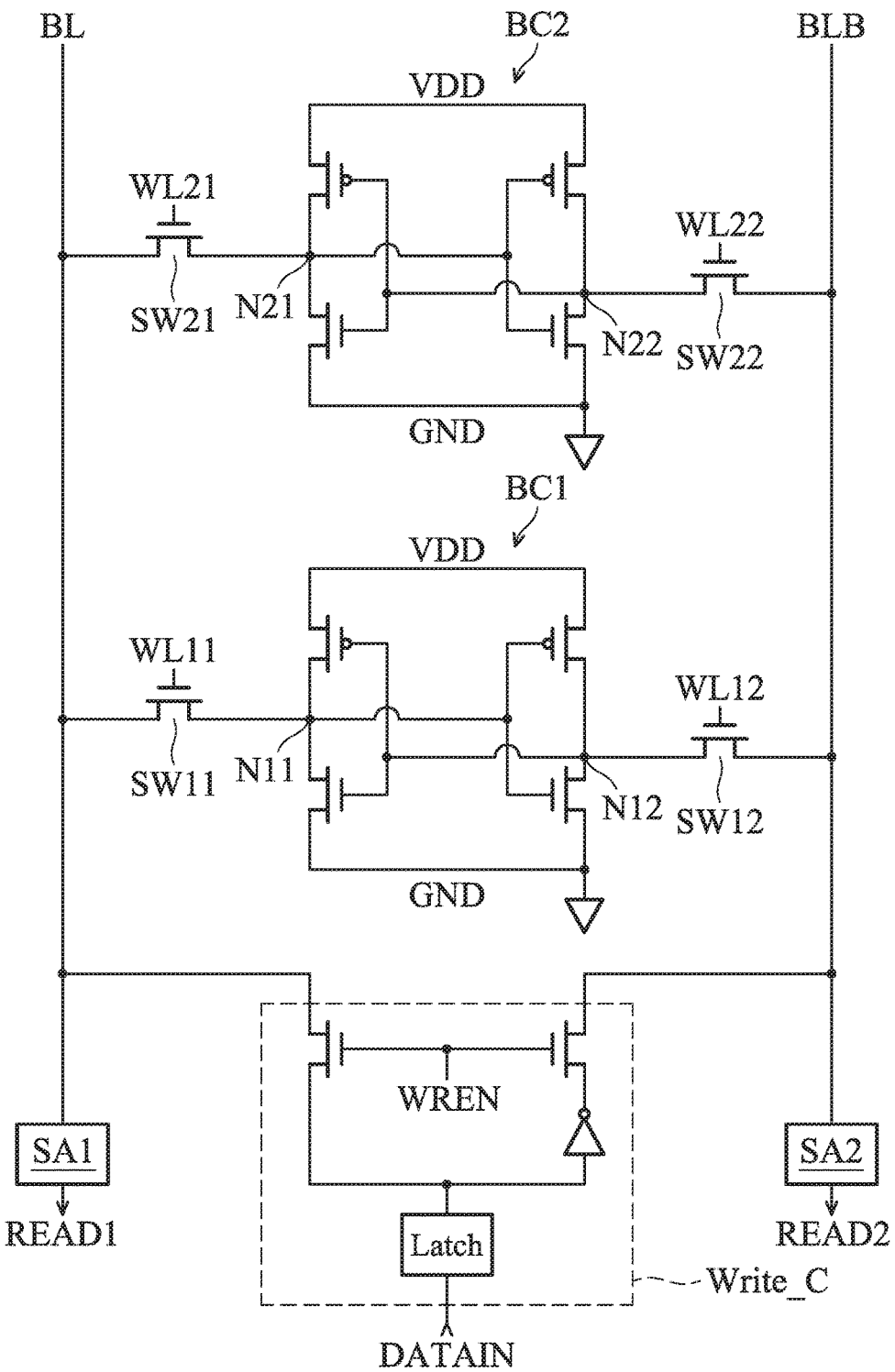
FIG. 1A depicts a static random access memory (SRAM) 100 in accordance with an exemplary embodiment of the disclosure.

FIG. 1A depicts a static random access memory (SRAM) 100 in accordance with an exemplary embodiment of the disclosure. FIG. 1A shows two bistable cells BC1 and BC2 sharing a pair of bit line and complementary bit line BL and BLB in a storage array to help understand the structure of the SRAM 100.

The bistable cell BC1/BC2 is implemented by a pair of cross-coupled complementary metal oxide semiconductor (CMOS) inverters (coupled to a power source VDD and a ground terminal GND). A sense amplifier SA1 is coupled to the bit line BL to get data READ1 from the bit line BL. A sense amplifier SA2 is coupled to the complementary bit line BLB to get data READ2 from the complementary bit line BLB. When the write enable signal WREN is enabled, write data DATAIN is coupled to the bit line BL and the complementary bit line BLB by the write circuit Write_C to be written to the enabled bistable cell.

The bistable cell BC1 has two access terminals N11 and N12 which respectively correspond to two access switches SW11 and SW12 that are controlled by two separate word lines WL11 and WL12. The access switch SW11 is operative to couple the access terminal N11 to the bit line BL. The access switch SW12 is operative to couple the access terminal N12 to the complementary bit line BLB. The bistable cell BC2 has two access terminals N21 and N22 which respectively correspond to two access switches SW21 and SW22 that are controlled by two separate word lines WL21 and WL22. The access switch SW21 is operative to couple the access terminal N21 to the bit line BL. The access switch SW22 is operative to couple the access terminal N22 to the complementary bit line BLB. When the word lines WL11 and WL22 are enabled and the word lines WL12 and WL21 are disabled, data stored in the bistable cell BC1 is conveyed to the sense amplifier SA1 by the bit line BL to be read as data READ1 and data stored in the bistable cell BC2 is conveyed to the sense amplifier SA2 by the complementary bit line BLB to be read as data READ2. When the word lines WL12 and WL21 are enabled and the word lines WL11 and WL22 are disabled, data stored in the bistable cell BC1 is conveyed to the sense amplifier SA2 by the complementary bit line BLB to be read as data READ2 and data stored in the bistable cell BC2 is conveyed to the sense amplifier SA1 by the bit line BL to be read as data READ1. In write operations, the write enable signal WREN is enabled, the bistable cell BC1 and the bistable cell BC2 are written separately. To write the bistable cell BC1, the word lines WL11 and WL12 are controlled to close (turn on) the access switch SW11 and SW12. Thus, the write data DATAIN coupled to the bit line BL and the complementary bit line BLB via the write circuit Write_C is further coupled to the bistable cell BC1. To write the bistable cell BC2, the word lines WL21 and WL22 are controlled to close the access switch SW21 and SW22. Thus, the write data DATAIN coupled to the bit line BL and the complementary bit line BLB via the write circuit Write_C is coupled to the bistable cell BC2. The write circuit Write_C has two transistors, one inverter and one latch circuit. The bistable cell BC1/BC2 has six transistors and achieves one write operation or two read operations at the same time even though only two transistors of the six transistors are access switches.

Figure 1B:
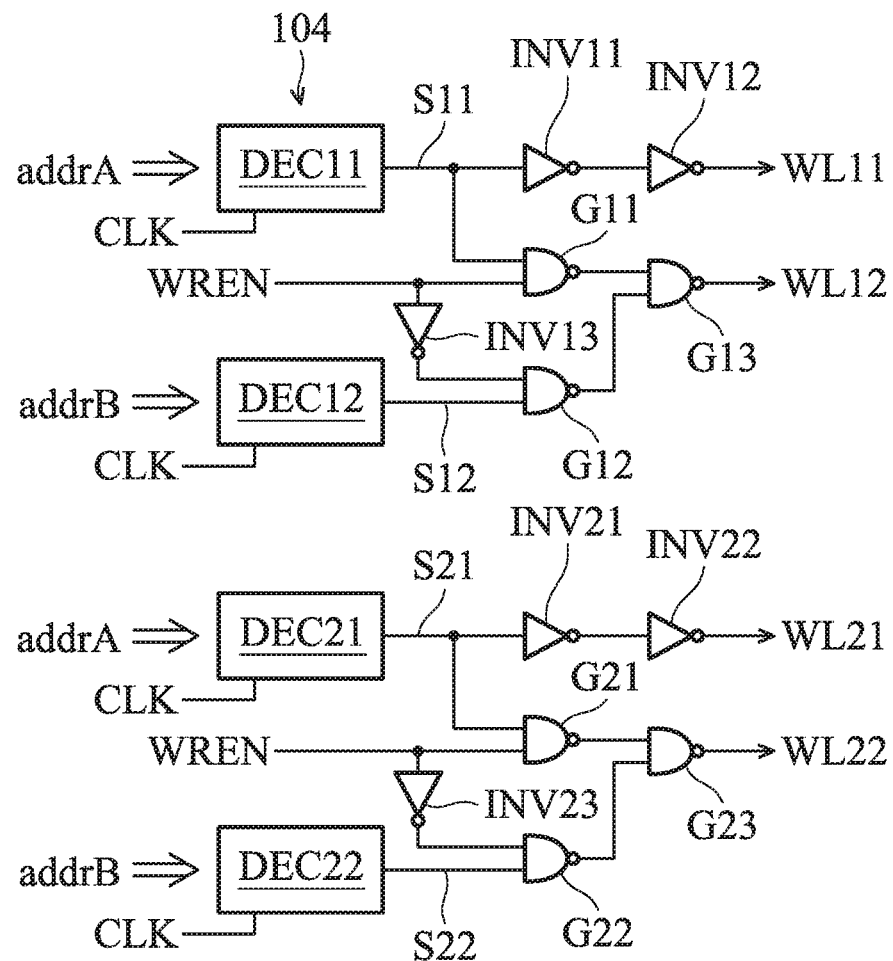
FIG. 1B depicts a word line control module 102 for the SRAM 100 in accordance with an exemplary embodiment of the disclosure, which especially focuses on the control of the word lines WL11 and WL12 corresponding to the bistable cell BC1 and the control of the word lines WL21 and WL22 corresponding to the bistable cell BC2.

FIG. 1B depicts a word line control module 102 for the SRAM 100 in accordance with an exemplary embodiment of the disclosure, which especially focuses on the control of the word lines WL11 and WL12 corresponding to the bistable cell BC1 and the control of the word lines WL21 and WL22 corresponding to the bistable cell BC2. There is a decoder 104 which is operated according to a clock signal CLK to generate decoded signals S11, S12, S21 and S22 based on address signals addrA and addrB. The decoder 104 includes decoding units DEC11, DEC12, DEC21 and DEC22. Inverters INV11 and INV12 are coupled in series to couple the decoded signal S11 to the word line WL11. Inverter INV13 has an input terminal coupled to the write enable signal WREN and has an output terminal. A NAND gate G11 has a first input terminal coupled to the decoded signal S11, a second input terminal coupled to the write enable signal WREN, and an output terminal. A NAND gate G12 has a first input terminal coupled to the output terminal of the inverter INV13, a second input terminal coupled to the decoded signal S12, and an output terminal. A NAND gate G13 has a first input terminal coupled to the output terminal of the NAND gate G11, a second input terminal coupled to the output of the NAND gate G12, and an output terminal coupled to the word line WL12. The inverters INV21 and INV22 are connected in series to couple the decoded signal S21 to the word line WL21. An inverter INV23 has an input terminal coupled to the write enable signal WREN, and has an output terminal. A NAND gate G21 has a first input terminal coupled to the decoded output S21, a second input terminal coupled to the write enable signal WREN, and an output terminal. A NAND gate G22 has a first input terminal coupled to the output terminal of the inverter INV23, a second input terminal coupled to the decoded output S22, and an output terminal. A NAND gate G23 has a first input terminal coupled to the output terminal of the NAND gate G21, a second input terminal coupled to the output terminal of the NAND gate G22, and an output terminal coupled to the word line WL22. When it is indicated by the address signal addrA to write the write data DATAIN to the bistable cell BC1, the decoder 104 asserts the decoded signal S11 and, with the enabled write enable signal WREN, the word lines WL11 and WL12 are enabled. When it is indicated by the address signal addrA to write the write data DATAIN into the bistable cell BC2, the decoder 104 asserts the decoded signal S21 and, with the enabled write enable signal WREN, the word lines WL21 and WL22 are enabled. In read operations, the write enable signal WREN is disabled. When it is indicated by the address signal addrA to read the bistable cell BC1, the decoder 104 asserts the decoded signal S11 to enable the word line WL11 to couple the bit line BL to the bistable cell BC1. At the same time, the word line WL12 is not affected by the word line WL11. When it is indicated by the address signal addrA to read the bistable cell BC2, the decoder 104 asserts the decoded signal S21 to enable the word line WL21 to couple the bit line BL to the bistable cell BC2. At the same time, the word line WL22 is not affected by the word line WL21. When it is indicated by the address signal addrB to read the bistable cell BC1, the decoder 104 asserts the decoded signal S12 to enable the word line WL12 to couple the complementary bit line BLB to the bistable cell BC1. When it is indicated by the address signal addrB to read the bistable cell BC2, the decoder 104 asserts the decoded signal S22 to enable the word line WL22 to couple the complementary bit line BLB to the bistable cell BC2.

Figure 1C:
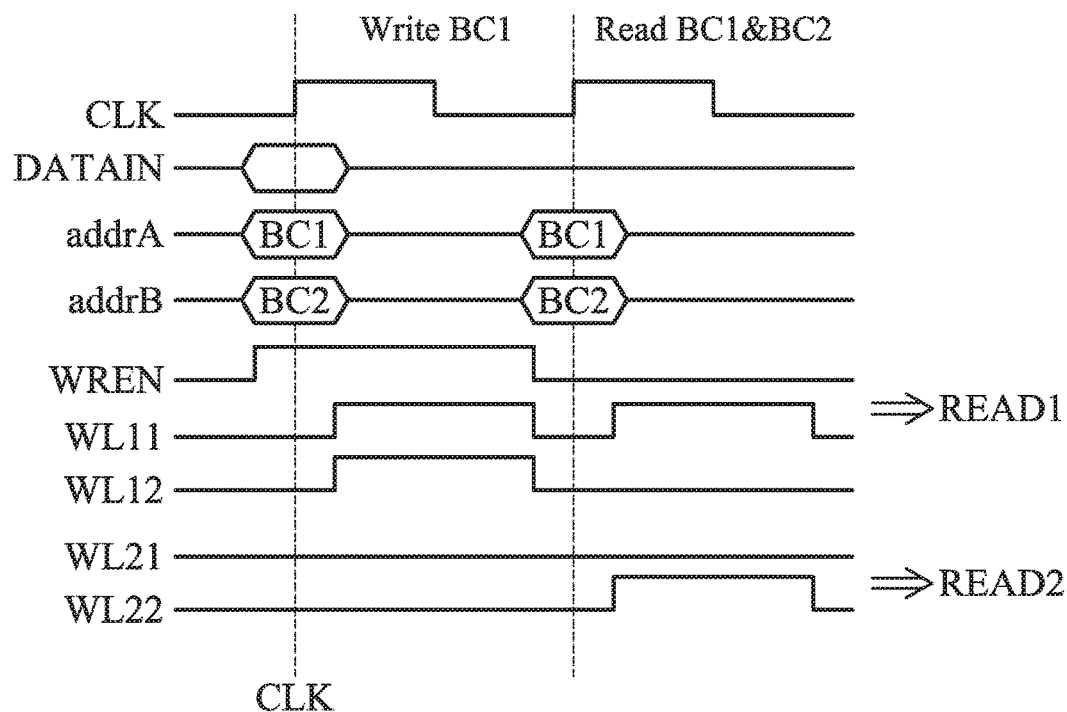
FIG. 1C shows waveforms for operating the SRAM 100 shown in FIG. 1A and FIG. 1B.

FIG. 1C shows waveforms for operating the SRAM 100 shown in FIG. 1A and FIG. 1B. As shown, when the write enable signal WREN is enabled, the SRAM 100 writes the write data DATAIN to the bistable cell BC1 indicated by the address signal addrA and thereby the word lines WL11 and WL12 are enabled to couple the bit line BL and the complementary bit line BLB to the bistable cell BC1. Thus, the write data DATAIN is successfully written to the bistable cell BC1. As for the read operations on the SRAM 100, the write enable signal WREN is disabled. Because the address signal addrA indicates the bistable cell BC1, the word line WL11 is enabled to couple the bit line BL to the bistable cell BC1. Thus, the data stored in the bistable cell BC1 is conveyed to the sense amplified SA1 and obtained as data READ1. Because the address signal addrB indicates the bistable cell BC2, the word line WL22 is enabled to couple the complementary bit line BLB to the bistable cell BC2. Thus, the data stored in the bistable cell BC2 is conveyed to the sense amplified SA2 and obtained as data READ2. As shown in FIG. 1C, the bistable cell BC1 and the bistable cell BC2 are read at the same time.

In addition to such six-transistor (6T) SRAM shown in FIGS. 1A, 1B and 1C, an eight-transistor (8T) SRAM is based on the same concept.

Figure 2A:
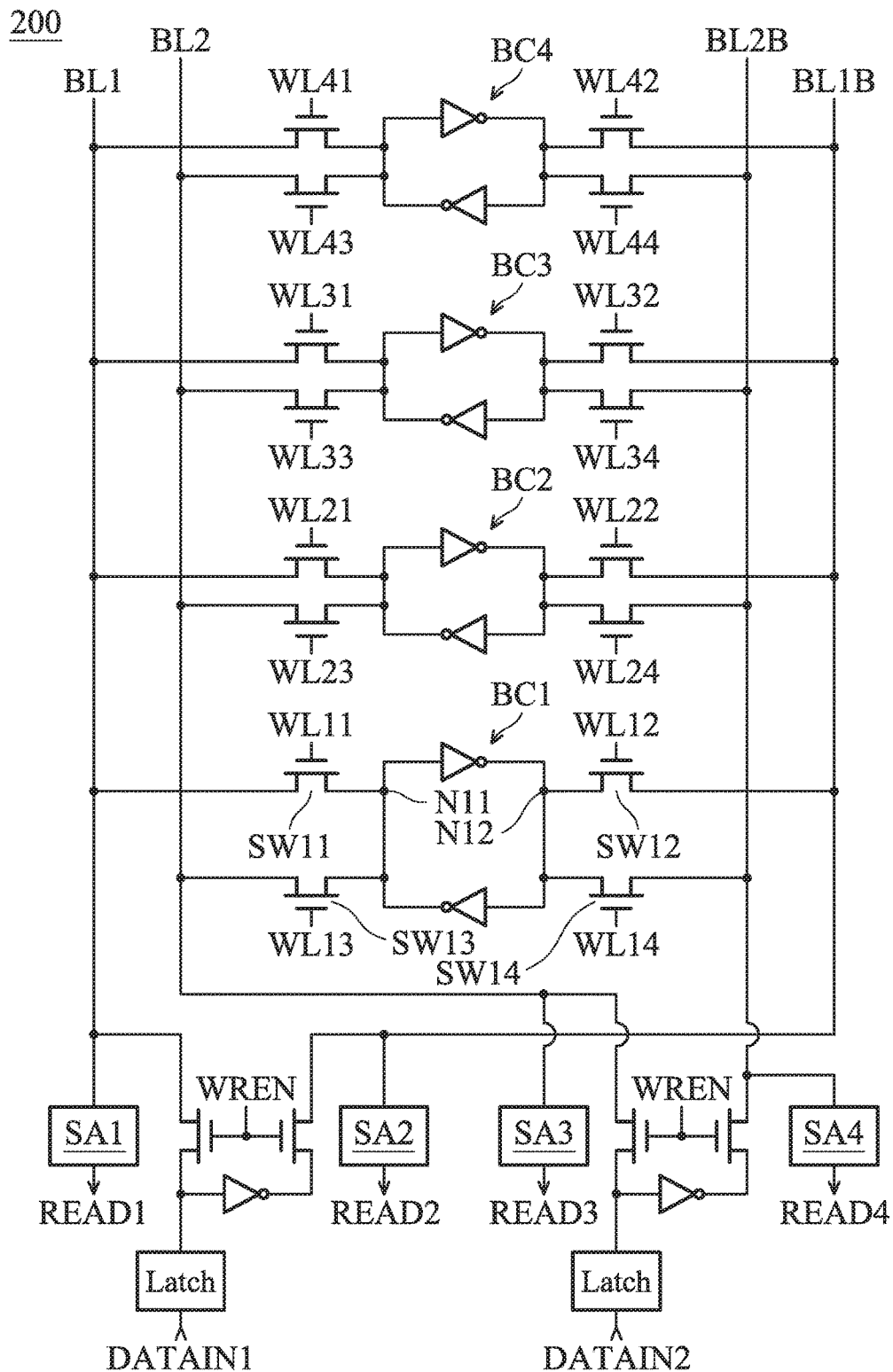
FIG. 2A shows an SRAM 200 with each storage cell having eight transistors.

FIG. 2A shows an SRAM 200 with each storage cell having eight transistors. Each storage cell relates to two pairs of bit line and complementary bit line. To help understand the structure of SRAM 200, the following discussion is focused on the four bistable cells BC1, BC2, BC3 and BC4 that share a first pair of bit line and complementary bit line (BL1 and BL1B) and a second pair of bit line and complementary bit line (BL2 and BL2B).

Each of the bistable cells BC1 to BC4 is implemented by a pair of cross-coupled CMOS inverters. Each bistable cell (any of BC1 to BC4) corresponds to four access switches and up to four word lines (referring to the word lines WL11, WL12, WL13 and WL14 corresponding to the bistable cell BC1, the word lines WL21, WL22, WL23 and WL24 corresponding to the bistable cell BC2, the word lines WL31, WL32, WL33 and WL34 corresponding to the bistable cell BC3, and the word lines WL41, WL42, WL43 and WL44 corresponding to the bistable cell BC4). The following discussion is about the bistable cell BC1, to help understand the operations on a bistable cell. An access switch SW11 is controlled according to word line WL11 to couple the access terminal N11 to the bit line BL1. An access switch SW12 is controlled according to word line WL12 to couple the access terminal N12 to the complementary bit line BL1B. An access switch SW13 is controlled according to word line WL13 to couple the access terminal N11 to the bit line BL2. An access switch SW14 is controlled according to word line WL14 to couple the access terminal N12 to the complementary bit line BL2B. The other bistable cells are in the similar structure. The connection between a bistable cell, e.g. BC1, and the bit line BL1, the connection between the bistable cell (BC1) and the complementary bit line BL1B, the connection between the bistable cell (BC1) and the bit line BL2, and the connection between the bistable cell (BC1) and the complementary bit line BL2B are controlled separately. A sense amplifier SA1 is coupled to the bit line BL1 to get data READ1 from the bit line BL1. A sense amplifier SA2 is coupled to the complementary bit line BL1B to get data READ2 from the complementary bit line BL1B. A sense amplifier SA3 is coupled to the bit line BL2 to get data READ3 from the bit line BL2. A sense amplifier SA4 is coupled to the complementary bit line BL2B to get data READ4 from the complementary bit line BL2B. At the same time, there may be up to four bits read from the bit line BL1, the complementary bit line BL1B, the bit line BL2 and the complementary bit line BL2B. As for write operations, there may be up to two bits to be written to two storage cells at the same time through the two pairs of bit line and complementary bit line BL1 and BL1B and BL2 and BL2B. To write data to the SRAM 200, the write enable signal WREN is enabled. As shown, the write data DATAIN1 is coupled to the bit line BL1 and the complementary bit line BL1B through the write circuit and then written to an enabled bistable cell, and the write data DATAIN2 is coupled to the bit line BL2 and the complementary bit line BL2B through the write circuit and then written to another enabled bistable cell. The write circuit similar to that shown in FIG. 1A is repeated here.

In summary, when reading the bistable cell BC1, only one access switch between the access switches SW11, SW12, SW13 and SW14 is close. Thus, three lines between the bit line BL1, the complementary bit line BL1B, the bit line BL2 and the complementary bit line BL2B, and not connected to the bistable cell BC1 may be separately coupled to other three bistable cells for data reading. When writing the write data DATAIN1 to the bistable cell BC1 through the bit line BL1 and the complementary bit line BL1B, the word lines WL11 and WL12 close the access switches SW11 and SW12 and the word lines WL13 and WL14 open the access switches SW13 and SW14. Thus, the bit line BL2 and the complementary bit line BL2B can be used in writing data to another bistable cell to store the write data DATAIN2. Because one inverter has two transistors, the 8T bistable cell BC1/BC2 only provides four transistors as access switches. Even though, two write operations or four read operations at the same time are achieved.

Figure 2B:
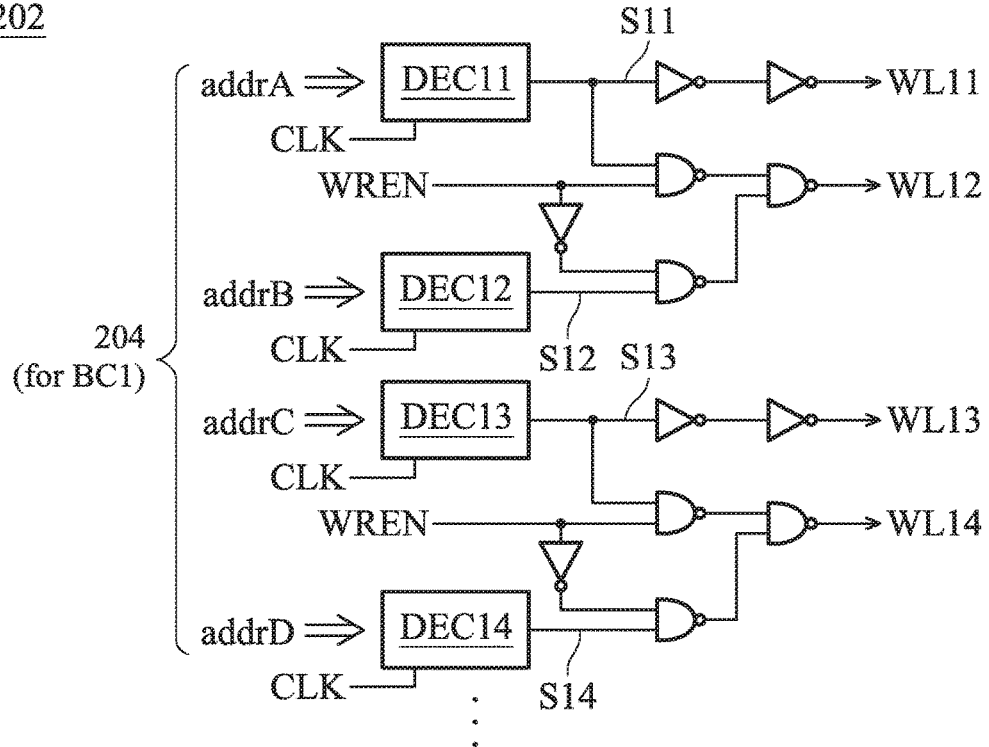
FIG. 2B depicts a word line control module 202 for the SRAM 200 in accordance with an exemplary embodiment of the disclosure.
Figure 2B:
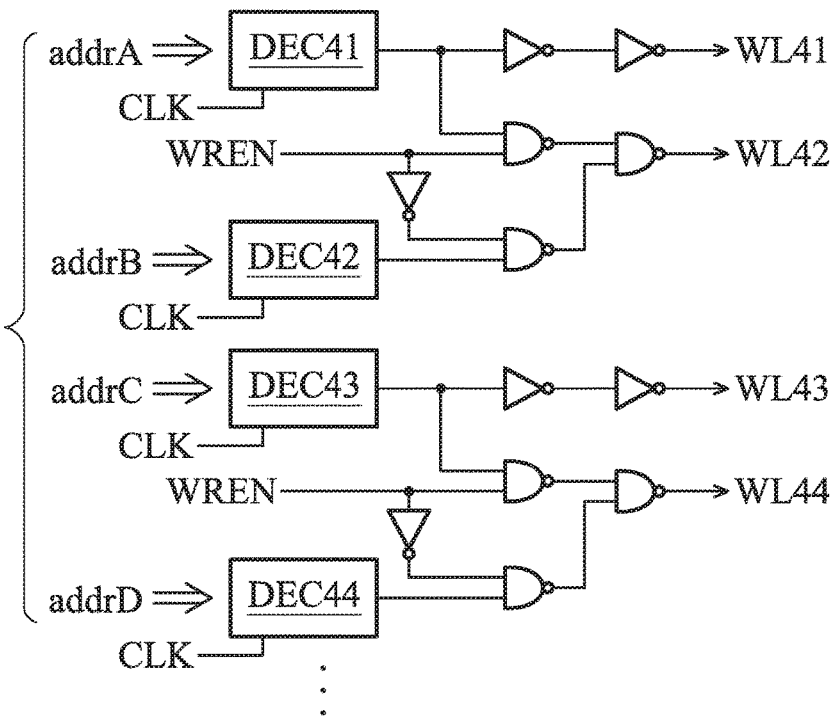

FIG. 2B depicts a word line control module 202 for the SRAM 200 in accordance with an exemplary embodiment of the disclosure. The control architecture for each pair of bit line and complementary bit line coupled to a bistable cell is similar to that shown in FIG. 1B. For simplicity, FIG. 2B focuses on a word line control structure 204 including decoding units DEC11 . . . DEC14 and logic gates for the bistable cell BC1 and a word line control structure 206 including decoding units DEC41 . . . DEC44 and logic gates for the bistable cell BC4. The word line control of the bistable cells BC2 and BC3 not shown in FIG. 2C is similar to that for the bistable cell BC1 or BC4.

To control the word lines WL11, WL12, WL13 and WL14 of the bistable cell BC1, the decoder including decoding units DEC11, DEC12, DEC13 and DEC14 generates decoded signals S11, S12, S13 and S14 based on the address signals addrA, addrB, addrC and addrD. When the address signal addrA indicates the bistable cell BC1 and the write enable signal WREN is enabled, the decoder asserts the decoded signal S11 to enable the word lines WL11 and WL12 both and the write data DATAIN1 is written to the bistable cell BC1 through the bit line BL1 and the complementary bit line BL1B. At the same time, the address signal addrC can indicate the bistable cell BC3 to drive the word line control structure of the bistable cell BC3 to enable the word lines WL33 and WL34 and thereby the write data DATAIN2 is written to the bistable cell BC3 through the bit line BL2 and the complementary bit line BL2B. In read operations, the write enable signal WREN is disabled and the four access switches of the same bistable cell are separately controlled. The different address signals addrA, addrB, addrC and addrD may indicate the different bistable cells BC1, BC2, BC3 and BC4. The word line control module 202 enables the words lines WL11, WL22, WL33 and WL44. The data READ1, READ2, READ3 and READ4 in the bistable cells BC1, BC2, BC3 and BC4 may be conveyed to the sense amplifiers SA1, SA2, SA3 and SA4 via the bit line BL1, the complementary bit line BL1B, the bit line BL2 and the complementary bit line BL2B, respectively.

Figure 2C:
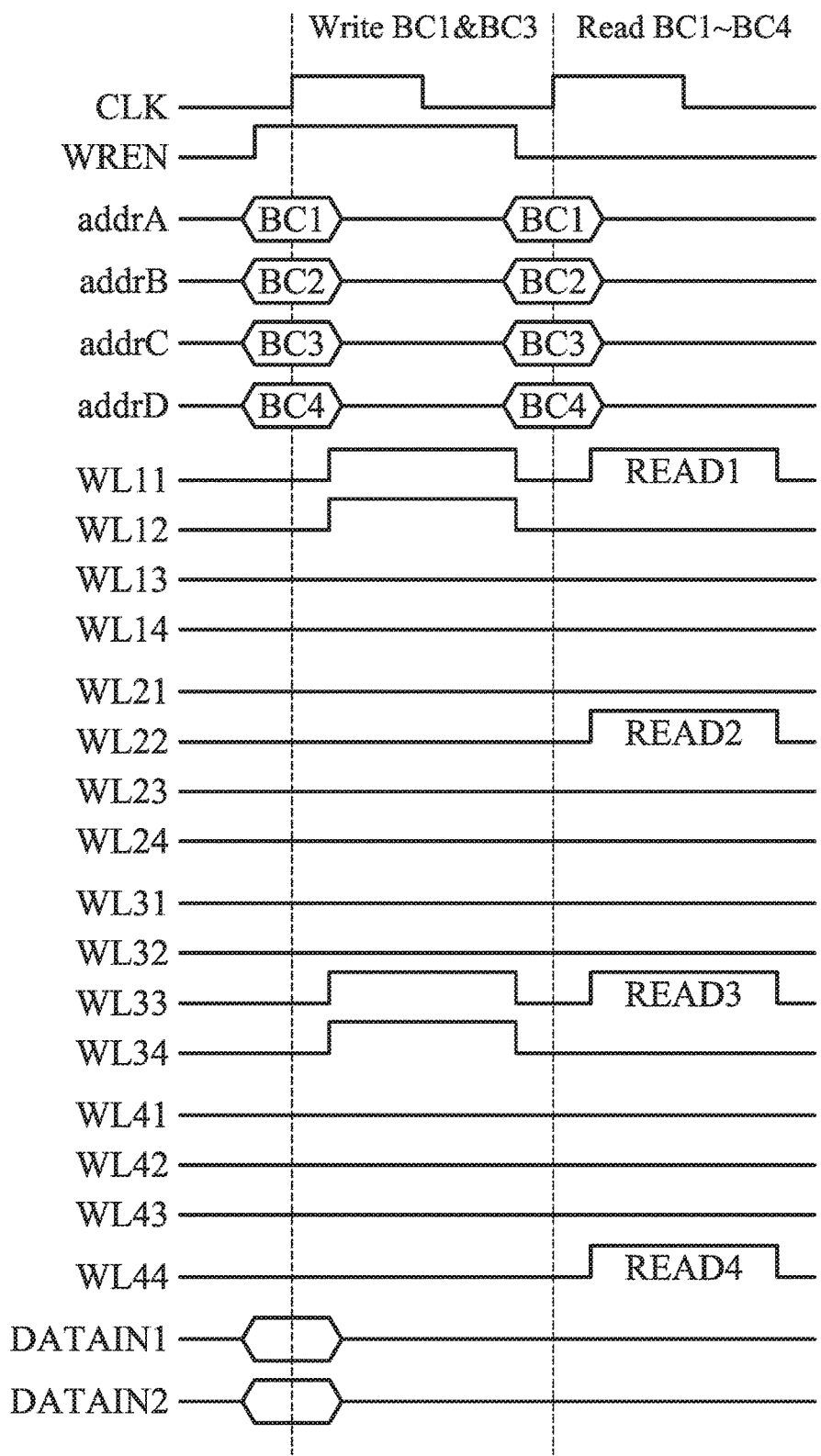
FIG. 2C shows waveforms for operating the SRAM 200 of FIG. 2A and FIG. 2B.

FIG. 2C shows waveforms for operating the SRAM 200 of FIG. 2A and FIG. 2B. When the write enable signal WREN is enabled, the SRAM 200 writes the write data DATAIN1 and DATAIN2 to the bistable cell BC1 indicated by the address signal addrA and the bistable cell BC3 indicated by the address signal addrC, respectively. Thus, the word lines WL11 and WL12 of the bistable cell BC1 are enabled and the word lines WL33 and WL34 of the bistable cell BC3 are enabled. The bit line BL1 and the complementary bit line BL1B are coupled to the bistable cell BC1 to write the write data DATAIN1 to the bistable cell BC1, and the bit line BL2 and the complementary bit line BL2B are coupled to the bistable cell BC3 to write the write data DATAIN2 to the bistable cell BC3. The write enable signal WREN is disabled for reading the SRAM 200. When the address signal addrA indicates the bistable cell BC1, the word line WL11 is enabled and the bit line BL1 is coupled to the bistable cell BC1 and the data stored in the bistable cell BC1 is conveyed to the sense amplifier SA1 by the bit line BL1 to be read as data READ1. When the address signal addrB indicates the bistable cell BC2, the word line WL22 is enabled and the complementary bit line BL1B is coupled to the bistable cell BC2 and the data stored in the bistable cell BC2 is conveyed to the sense amplifier SA2 by the complementary bit line BL1B to be read as data READ2. When the address signal addrC indicates the bistable cell BC3, the word line WL33 is enabled and the bit line BL2 is coupled to the bistable cell BC3 and the data stored in the bistable cell BC3 is conveyed to the sense amplifier SA3 by the bit line BL2 to be read as data READ3. When the address signal addrD indicates the bistable cell BC4, the word line WL44 is enabled and the complementary bit line BL2B is coupled to the bistable cell BC4 and the data stored in the bistable cell BC4 is conveyed to the sense amplifier SA4 by the complementary bit line BL2B to be read as data READ4. FIG. 2C shows that the bistable cells BC1, BC2, BC3 and BC4 are read at the same time.

Figure 3:
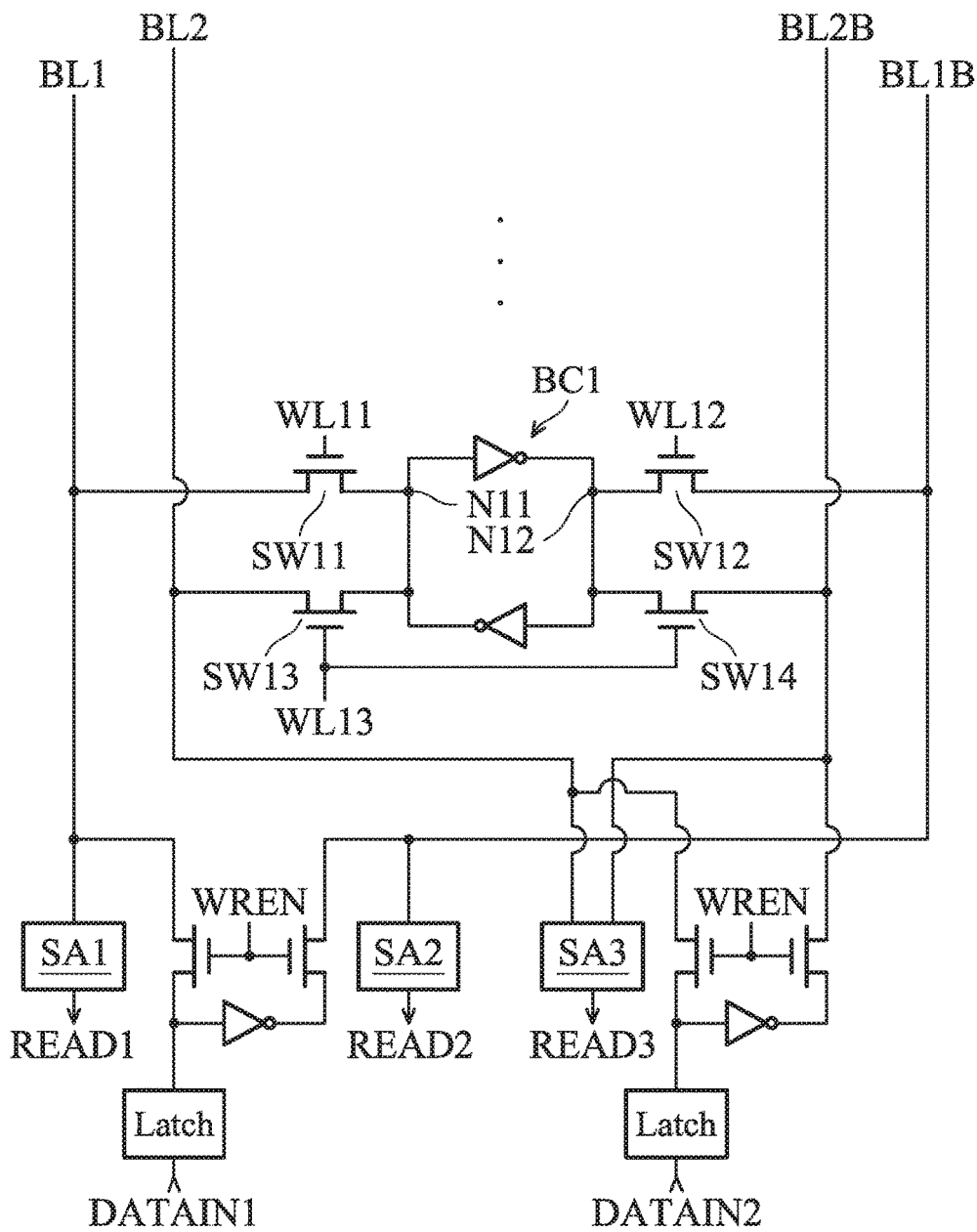
FIG. 3 shows another way to implement an eight-transistor storage cell.

FIG. 3 shows another way to implement an eight-transistor storage cell. Referring to SRAM 300 shown in FIG. 3, the separate control on the bit line and the complementary bit line is performed on only one bit line and complementary bit line pair of the bistable cell BC1. An access switch SW11 is controlled by a word line WL11 to couple the bistable cell BC1 to a bit line BL1 and an access switch SW12 is controlled by a word line WL12 to couple the bistable cell BC1 to a complementary bit line BL1B. Two access switches SW13 and SW14 both are controlled by a word line WL13 to couple the bistable cell BC1 to a bit line BL2 and a complementary bit line BL2B. A sense amplifier SA1 is coupled the bit line BL1 to get data READ1 from the bit line BL1. A sense amplifier SA2 is coupled the complementary bit line BL1B to get data READ2 from the complementary bit line BL1B. A sense amplifier SA3 is coupled the bit line BL2 and the complementary bit line BL2B both to get data READ3. As shown, one bit is read from the bit line BL1, one bit is read from the complementary bit line BL1B and one bit is read from the bit line BL2 and the complementary bit line BL2B at the same time. During write operations, up to two bits can be written to the SRAM 300 by the two pairs of bit line and complementary bit line BL1 and BL1B and BL2 and BL2B at the same time. To write data to the SRAM 300, the write enable signal WREN is enabled. The write data DATAIN1 is written to an enabled bistable cell through the bit line BL1 and the complementary bit line BL1B while the write data DATAIN2 is written to another enabled bistable cell through the bit line BL2 and the complementary bit line BL2B. The write circuit similar to that shown in FIG. 1A is not repeated here.

A bistable cell with separately controlled bit line and complementary bit line is within the scope of the invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A static random access memory, comprising:
   a first bistable cell, having a first access terminal, a second access terminal, a first access switch and a second access switch;
   a first bit line and a first complementary bit line;
   a first word line and a second word line;
   a decoder, generating a first decoded signal and a second decoded signal based on a first address signal and a second address signal;
   a first inverter and a second inverter coupled in series to couple the first decoded signal to the first word line;
   a third inverter, having an input terminal coupled to a write enable signal and having an output terminal;
   a first NAND gate, having a first input terminal coupled to the first decoded signal, a second input terminal coupled to the write enable signal, and an output terminal;
   a second NAND gate, having a first input terminal coupled to the output terminal of the third inverter, a second input terminal coupled to the second decoded signal, and an output terminal; and
   a third NAND gate, having a first input terminal coupled to the output terminal of the first NAND gate, a second input terminal coupled to the output terminal of the second NAND gate, and an output terminal coupled to the second word line,
   wherein:
   the first access switch is controlled by the first word line to couple the first access terminal to the first bit line; and
   the second access switch is controlled by the second word line to couple the second access terminal to the first complementary bit line.

2. The static random access memory as claimed in claim 1, wherein:
   when writing data to the first bistable cell, the first word line and the second word line close the first access switch and the second access switch, respectively; and
   the first bistable cell has six transistors wherein the first and second access switches are two transistors of the six transistors.

3. The static random access memory as claimed in claim 1, further comprising:

a first sense amplifier, coupled to the first bit line; and
   a second sense amplifier, coupled to the first complementary bit line.

4. The static random access memory as claimed in claim 1, further comprising:
   a second bistable cell, having a third access terminal and a fourth access terminal;
   a third word line and a fourth word line;
   a third access switch, controlled by the third word line to couple the third access terminal to the first bit line; and
   a fourth access switch, controlled by the fourth word line to couple the fourth access terminal to the first complementary bit line.

5. The static random access memory as claimed in claim 4, which enables the first word line and the fourth word line and disables the second word line and the third word line to use the first bit line to read data from the first bistable cell and to use the first complementary bit line to read data from the second bistable cell.

6. The static random access memory as claimed in claim 4, which enables the second word line and the third word line and disables the first word line and the fourth word line to use the first complementary bit line to read data from the first bistable cell and to use the first bit line to read data from the second bistable cell.

7. The static random access memory as claimed in claim 4, wherein:
   when the first address signal indicates the first bistable cell for data writing, the decoder asserts the first decoded signal and the write enable signal is enabled;
   when the first address signal indicates the first bistable cell for data reading, the decoder asserts the first decoded signal; and
   when the second address signal indicates the first bistable cell for data reading, the decoder asserts the second decoded signal.

8. The static random access memory as claimed in claim 7, further comprising:
   a fourth inverter and a fifth inverter coupled in series to couple a third decoded signal to the third word line;
   a sixth inverter, having an input terminal coupled to the write enable signal and having an output terminal;
   a fourth NAND gate, having a first input terminal coupled to the third decoded signal, a second input terminal coupled to the write enable signal, and an output terminal;
   a fifth NAND gate, having a first input terminal coupled to the output terminal of the sixth inverter, a second input terminal coupled to a fourth decoded signal, and an output terminal; and
   a sixth NAND gate, having a first input terminal coupled to the output terminal of the fourth NAND gate, a second input terminal coupled to the output terminal of the fifth NAND gate, and an output terminal coupled to the fourth word line;
   wherein:
   when the first address signal indicates the second bistable cell for data writing, the decoder asserts the third decoded signal and the write enable signal is enabled;
   when the first address signal indicates the second bistable cell for data reading, the decoder asserts the third decoded signal; and
   when the second address signal indicates the second bistable cell for data reading, the decoder asserts the fourth decoded signal.

9. The static random access memory as claimed in claim 1, further comprising:

a second bit line and a second complementary bit line; and
a fifth word line and a sixth word line,
wherein:
the first bistable cell further comprises a fifth access switch and a sixth access switch;
the fifth access switch is controlled by the fifth word line to couple the first access terminal to the second bit line; and
the sixth access switch is controlled by the sixth word line to couple the second access terminal to the second complementary bit line.

10. The static random access memory as claimed in claim 9, further comprising:
a first sense amplifier, coupled to the first bit line;
a second sense amplifier, coupled to the first complementary bit line;
a third sense amplifier, coupled to the second bit line; and
a fourth sense amplifier, coupled to the second complementary bit line.

11. The static random access memory as claimed in claim 9, wherein:
when one access switch between the first access switch, the second access switch, the fifth access switch and the sixth access switch is close for reading the first bistable cell, the other three access switches are open and thereby the three lines between the first bit line, the first complementary bit line, the second bit line and the second complementary bit line and not coupled to the first bistable cell are coupled to other three bistable cells for data reading; and
the first bistable cell comprises eight transistors, and the first, second, fifth and sixth access switches are four transistors of the eight transistors.

12. The static random access memory as claimed in claim 9, wherein:
when writing data to the first bistable cell through the first bit line and the first complementary bit line, the first word line and the second word line separately close the first access switch and the second access switch and the fifth word line and the sixth word line open the fifth access switch and the sixth access switch to allow writing data to another bistable cell through the second bit line and the second complementary bit line.

13. The static random access memory as claimed in claim 1, further comprising:
a second bit line and a second complementary bit line; and
a fifth word line,
wherein:
the first bistable cell further comprises a fifth access switch and a sixth access switch;
the fifth access switch is controlled by the fifth word line to couple the first access terminal to the second bit line; and
the sixth access switch is controlled by the fifth word line to couple the second access terminal to the second complementary bit line.

14. The static random access memory as claimed in claim 13, further comprising:
a first sense amplifier, coupled to the first bit line;
a second sense amplifier, coupled to the first complementary bit line; and
a third sense amplifier, coupled to the second bit line and the second complementary bit line.

15. The static random access memory as claimed in claim 13, wherein:
when reading the first bistable cell by enabling only one word line between the first word line, the second word line and the fifth word line, the lines between the first bit line, the first complementary bit line, the second bit line and the second complementary bit line and not coupled to the first bistable cell are coupled to other two bistable cells for data reading; and
the first bistable cell comprises eight transistors, and the first, second, fifth and sixth access switches are four transistors of the eight transistors.

16. The static random access memory as claimed in claim 13, wherein:
when writing data to the first bistable cell through the first bit line and the first complementary bit line, the first word line and the second word line separately close the first access switch and the second access switch and the fifth word line opens the fifth access switch and the sixth access switch to allow writing data to another bistable cell through the second bit line and the second complementary bit line.

* * * * *